US006615369B1

United States Patent
Beck et al.

(10) Patent No.: US 6,615,369 B1
(45) Date of Patent: Sep. 2, 2003

(54) LOGIC ANALYZER WITH TRIGGER SPECIFICATION DEFINED BY WAVEFORM EXEMPLAR

(75) Inventors: Douglas J. Beck, Colorado Springs, CO (US); John H. Friedman, Colorado Springs, CO (US); Douglas F. Robison, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/494,293

(22) Filed: Jan. 31, 2000

(51) Int. Cl.[7] ................................. G06F 11/25
(52) U.S. Cl. ......................... 714/39; 714/45
(58) Field of Search ..................... 714/39, 45, 46, 714/33; 709/318; 717/128, 129

(56) References Cited

U.S. PATENT DOCUMENTS

| | | | | |
|---|---|---|---|---|
| 5,771,240 A | * | 6/1998 | Tobin et al. | 714/724 |
| 6,396,517 B1 | * | 5/2002 | Beck et al. | 345/771 |
| 6,407,756 B1 | * | 6/2002 | Sontag et al. | 345/771 |
| 6,522,345 B1 | * | 2/2003 | Alexander | 345/771 |
| 6,570,592 B1 | * | 5/2003 | Sajdak et al. | 345/769 |
| 2001/0000964 A1 | * | 5/2001 | Alexander | 345/440 |

* cited by examiner

Primary Examiner—Scott Baderman
(74) Attorney, Agent, or Firm—Edward L. Miller

(57) ABSTRACT

Waveform segment(s) of interest in the displayed logic analyzer trace can create the desire in an operator to re-define the trigger specification to be those segments. Those waveform segments are identified to the logic analyzer by drawing a "rubber band" box around them even as they are displayed as part of the trace. The analyzer is instructed to automatically create therefrom, by itself, the desired new trigger specification. It does this by inspecting the captured data corresponding to the contents of the box and creating a description of the associated signal(s) in terms of transitions and steady state conditions. These individual descriptions of activity are then assembled into a trigger specification according to certain rules. More than one box may be drawn. Multiple-boxes may be "stacked" to include waveform segments separated vertically by intervening waveforms for other signals that are to be excluded. Boxed transitions that appear to line up vertically are treated as though they happened at the same time, even if they in actual fact, did not. Multiple boxes may be displaced horizontally, in which case a sequential ordering of separate events is generally implied. Screens having auxiliary menus needed to complete the trigger specification are automatically produced.

6 Claims, 5 Drawing Sheets

LOGIC ANALYZER WITH TRIGGER SPECIFICATION DEFINED BY WAVEFORM EXEMPLAR

REFERENCE TO RELATED APPLICATIONS

The subject matter of the present case is related to that which is disclosed in (1) U.S. Patent Application entitled LOGIC ANALYZER WITH MIXED TEXTUAL AND GRAPHICAL TRIGGER SPECIFICATION, Ser. No. 09/492,508, and filed on Jan. 27 2000 by Beck, Backsen, Robison and Friedman. The subject matter of that case is in turn related to that which is disclosed in two previously filed cases. These cases are (2): Ser. No. 09/432,840, filed Oct. 29 1999 by Beck, Backsen, Robison and Friedman and entitled SYSTEM AND METHOD FOR DEFINING AND GROUPING SIGNALS AND BUSES OF A SIGNAL MEASUREMENT SYSTEM USING SELECTION LISTS ON A GRAPHICAL USER INTERFACE; and, (3) Ser. No. 09/261,313, filed Mar. 1999, now U.S. Pat. No. 6,396,317 by Beck, Roeca, Griggs, Haeffele and Samuels and entitled AN INTEGRATED TRIGGER FUNCTION DISPLAY SYSTEM AND METHODOLOGY FOR TRIGGER DEFINITION DEVELOPMENT IN A SIGNAL MEASUREMENT SYSTEM HAVING A GRAPHICAL USER INTERFACE. These three U.S. Patent Applications (1)–(3) are hereby expressly incorporated herein by reference.

BACKGROUND OF THE INVENTION

Logic analyzers are test equipment that allow inspection of patterns ("logic states") in logic signals, and detect the occurrence therein of selected events. Early equipment that met this definition operated upon serially transmitted data, such as the bits of characters being sent via RS-232 or register contents being sent over serial busses in a serial micro-processor environment. At present, serial micro-processors are less prevalent than their parallel counterparts, although the serial bit-wise transmission of data continues in many forms (e.g., Internet protocol over an Ethernet), and the term "logic analyzer" has generally come to refer to equipment that deals with data occurring in parallel form (as on a sixty-four bit wide bus). The task of serial data analysis has been undertaken by "serial data analyzers" and protocol analyzers. Despite this divergence, many of the fundamental concepts remain the same or quite similar (e.g., the notion of triggering), and despite that fact that our examples are presented in the realm of parallel data, it will nonetheless be appreciated that the techniques described below have applicability in the serial environment as well as in the parallel one.

A logic analyzer is an instrument that samples and acquires digital data from a DUT (Device Under Test) or SUT (System Under Test). In some respects its operation resembles its cousin, the digital oscilloscope, in that they both acquire data to produce waveforms. However, the digital 'scope can store finely graduated amplitude information, and can condition its trigger on such things as the rate at which a voltage changes. The timing analyzer deals only in highs and lows (excursions about a defined threshold), and only triggers in response to patterns in the data. Modem logic analyzers can be operated either in a timing mode (where samples are acquired at regular intervals, like an oscilloscope) or in a state mode (where the samples are acquired when specific signals occur on the DUT). Logic analyzers are also capable of displaying data as waveforms. This is a standard feature on most commercially available logic analyzers.

Modern logic analyzers have evolved into powerful and sophisticated systems that can monitor hundreds of channels and store tens of millions of states, collectively called a trace, which is stored in a trace memory. However, such a wealth of data is valuable only (1) there is some assurance that the event(s) of interest is indeed among the data; and (2) if the event(s) of interest are not obscured by the sheer number of other routine or uninteresting events that might also be recorded in the trace memory. While post acquisition analysis of a long trace is always a possibility, there are more satisfactory and efficient solutions to this problem. Storage qualification pertains to ways of initially excluding from storage events that are deemed uninteresting. Storage qualification restricts what events that are placed into memory to those that meet some standing criteria; e.g., data read from a certain address in memory. Being finite, however, the memory may eventually be filled, whereupon it is treated as circular and new data overwrites the oldest data. The notion of triggering, on the other hand, is used to recognize the occurrence of some condition believed to be THE EVENT OF INTEREST, and subsequently terminate (immediately or eventually) the data acquisition phase of the measurement (lest the event of interest be overwritten by subsequently acquired data). The stored data of the trace may be likened to a list, and if the trigger event were used in such a way that it occurs at the middle of the completed trace list, then subsequent examination of the trace list would reveal events that led up to the trigger event, as well as those that happened afterwards. It is customary to be able to specify where in the trace list the trigger is to appear, and it is prominently identified as such in the list.

Capturing the desired data frequently hinges on being able to specify a sufficiently meaningful trigger condition. That is, the desired trigger condition (the trigger specification) might be a fairly complicated sequence of events, perhaps even involving alternatives. Often that task of trigger specification development is problematic, since, if one knew what was wrong there would likely be no need to specify a trigger in the first place. But given that there is an unknown problem, one is sometimes forced to discover an effective trigger specification by successive refinement, even with the aid of powerful trigger techniques. This has led to the development of many useful triggering schemes, to which logic analyzers owe much of their present utility.

Initially, trigger specifications were described in boolean terms, using signal names associated with factory assigned input channel names belonging to the analyzer itself, rather than using names associated with the system being investigated. In due course logic analyzers changed to allow the user to specify that certain inputs to the analyzer were to be treated as a field identified by a name, usually called a label. Thus, the operator became free to describe events in terms of more meaningful descriptors, such as ADDR (referring to a defined collection of thirty-two inputs representing an address), DATA (another user defined collection of inputs) and READ (a single bit control line). Once these correspondences are established the associated labels may be treated as variables, allowing the formation of relationships such as ADDR =XXXXXXXX$_6$. A trigger specification is an assemblage of labels used as operands in conjunction with various logical operators, such as AND, OR and NOT, possibly including parenthesis, and forming logical expressions with constants (fixed values) and the relations =, < and >. Labels are much easier to work with than, say, logic analyzer channel numbers, since they are descriptive in terms of the system being investigated. Such a textual boolean description of a trigger specification resembles a segment of programming, perhaps similar to C. The HP 1670 series Logic State Analyzers are representative of this textual mode of trigger specification. Handy as it is, however, the textual boolean representation can also sometimes be difficult to create correctly, particularly when elaborate sequences in time are involved. Not all users are comfortable with such a textual description, especially when timing or duration relationships between signals are to be expressed.

In addition, virtually all logic analyzers can display their acquired results not merely as columnar list of symbols, but also as a waveform diagram. Consider the following situation. A trace has been obtained and upon inspection, the data therein reveals, right there in the trace, the existence of some event (some combination and or sequence of signal conditions) that would be a more productive trigger specification than the one that was just used. At this point the operator of the analyzer is thinking: "Aha! I should trigger on that." What he or she then wants to do is change the trigger specification accordingly and perform the measurement again, the better to get an informative description of the event of interest.

All the information needed to extract the desired now trigger specification is present in a display of the trace. But to alter the existing trigger specification or create a new one, it will generally be necessary to leave the screen (or screens) displaying the waveforms of interest and enter ones specific to trigger specification. So the new trigger information of interest is now some distance removed, and now longer visible. Furthermore, it will be necessary to convert this graphical display of a waveform (or segments thereof) into some other format used to specify trigger conditions, such as a textual description involving binary relationships. Many users find converting from a waveform representation to a conventional textual one to be an aggravating and error prone task, perhaps even difficult. These circumstance increase the inconvenience and the possibility of error during the creation of the new trigger specification. It would be desirable if there were an easy and convenient way to utilize the existing waveform display in the definition of the new trigger-specification, and to avoid having to either leave that display or convert its meaning into another format.

SUMMARY OF THE INVENTION

By assumption, there is a (are) certain waveform segment(s) of interest in the displayed logic analyzer trace that caused the urge to re-define the trigger specification in the first place. That (those) waveform segment(s) are identified to the logic analyzer by drawing a "rubber band" box around them even as they are displayed as part of the trace. The analyzer is instructed to automatically create therefrom, by itself, the desired new trigger specification. It does this by inspecting the captured data corresponding to the contents of the box and creating a description of the associated signal(s) in terms of transitions and steady state conditions. These individual descriptions of activity are then assembled into a trigger specification according to certain rules. More than one box may be drawn. Multiple boxes may be "stacked" to include waveform segments separated vertically by intervening waveforms for other signals that are to be excluded. Boxed transitions that appear to line up vertically are treated as though they happened at the same time, even if they in actual fact, did not. Multiple boxes may be displaced horizontally, in which case a sequential ordering of separate events is generally implied. Various screens having auxiliary menus needed to complete the trigger specification are automatically produced as required.

DESCRIPTION OF A PREFERRED EMBODIMENT

Figure 1:
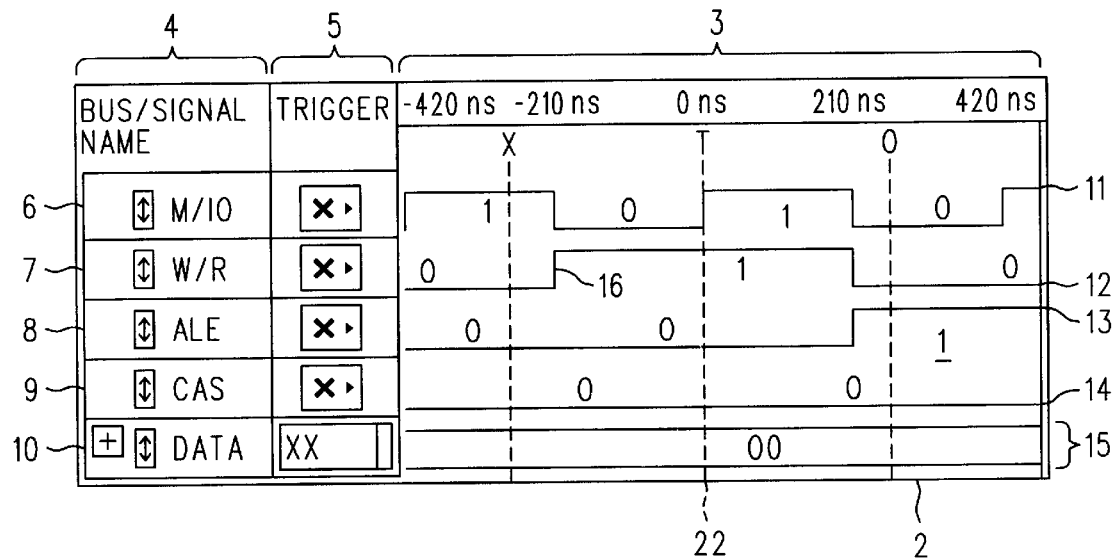
FIG. 1 is a representation of a conventional waveform display screen produced by a logic analyzer.

Refer now to FIG. 1, which is a representation of a conventional waveform display screen 1 produced by a logic analyzer. It will be convenient to use the customary term "screen" to refer to an image such as the waveform display 1, since even though the particular waveform content, their number and names, etc., may change from one instance to the next, the overall format of the display 1 remains the same. There are a number of such screens that will be of interest to us as this Description proceeds.

The various screens are part of what is generally termed a GUI (Graphical User Interface, usually pronounced "gooey") . The components of a GUI are a display mechanism (LCD or CRT) and pointing device (mouse, track ball, etc.) and associated screen pointer. Software (generally at the operating system level) provides a facility for putting the images of menus, buttons and other "controls" and character entry fields into the various screens, for highlighting or otherwise selecting portions of displayed information, and for communicating user level control information between the operator and the software (which may —probably does — include application software). At a fundamental level a GUI is simply the existence and use of this now familiar mode of interaction between a user and a program. Yet not all GUI's are alike, even when the same or comparable tool sets are used. The arrangement of the component tools into paradigms to allow easy and intuitive control over complicated process carried out by non operating system software is part of the user interface perceived by the operator, and is essentially an extension of the GUI. To be successful, this extension of the GUI requires an understanding of the problems addressed by the application software and skill in crafting a user interface from the component tools supplied by the operating system. The screens we shall be interested in are of this latter sort.

In terms of its measurement capabilities, the logic analyzer itself is generally similar in nature to the ones described in the incorporated applications, and has a CRT upon which various screens (displays) are presented, a keyboard for entering information such as labels and numeric parameter values, and a mouse for controlling a screen pointer. These elements are coupled together in a known way to data acquisition hardware and memory, all under the control of suitable algorithms executed by a processor to form a working logic analyzer that may also operate in a timing mode. The logic analyzer may be, for example, a model 1670G from Agilent Technologies.

The waveform display screen 1 appears in a window 2 (provided by a conventional window manager subsystem within an operating system, such as Windows 98 from the Microsoft corporation) and includes a waveform region 3, a label region 4 and a simple trigger region 5. The label region 4 indicates individual signals and buses (collections of related signals) of interest and that have previously been assigned names (labels) by the operator. In the example of FIG. 1, there are four signals (6–9) and one bus named DATA (10). The waveform region 3 shows, at the conclusion of a measurement, a trace of the signals of interest, centered about the trigger event, which is indicated by the T cursor 22. In this example there are four individual waveforms (11–14) and one bus waveform (15). This measurement has an associated trigger specification, although we need not be especially concerned with exactly what it is. The point is that it exists, and that it resulted a measurement and an associated waveform diagram. Having gotten to that point, we observe the waveform diagram, and wish to establish as a new trigger specification some relationship that is visible in that displayed waveform diagram.

Before proceeding, a brief word is in order about the simple trigger region 5. It is essentially a convenient shortcut, and allows the definition of relatively uncomplicated trigger specifications. It also indicates what trigger specification is in effect, even if that specification originated from another (more capable) screen or other trigger specification definition mechanism, provided that the defined trigger specification is not too complicated. Once a certain level of complexity is reached the simple trigger region 5 is grayed out.

In the present example of FIG. 1, the simple trigger region 5 is not grayed out, nor does it indicate a definite signal condition as the trigger specification. It indicates all don't cares, which is to say, the trigger condition will be met by any signal activity. This is a default specification, as is the accompanying location of the trigger event (at the center of the trace). Simple trigger region 5 could indicate some particular definite trigger specification, but in this example, does not. All don't cares is not as bizarre as it might seem, however, and is actually a common starting point for investigative activity. (Suppose a system is not booting correctly. The (default) all don't care trigger specification above says: "Trigger as soon as there is any activity." This is an ideal way to capture the initial activity in a system.)

To proceed then, let us suppose that an operator has obtained the trace in waveform display region 3 of FIG. 1, whereupon his or her interest is drawn to the vicinity of the transition 16 in the waveform 12 for the signal W/R 7. Now, in our example it is not so much that the transition 16, and the values of the other signals at that point in time, are suspicious or incorrect. They might be perfectly proper, or not. The point is that they constitute a desirable condition to trigger on; not every trigger condition has to be THE ERROR, and a legitimate combination of events (as here) may serve as the trigger for investigating other system activity. So, for whatever reason, our operator desires to alter the trigger specification to include the rising transition 16 of signal W/R 7, in conjunction with the shown values of the signals ALE 8, CAS 9 and the bus DATA 10.

Figure 2:
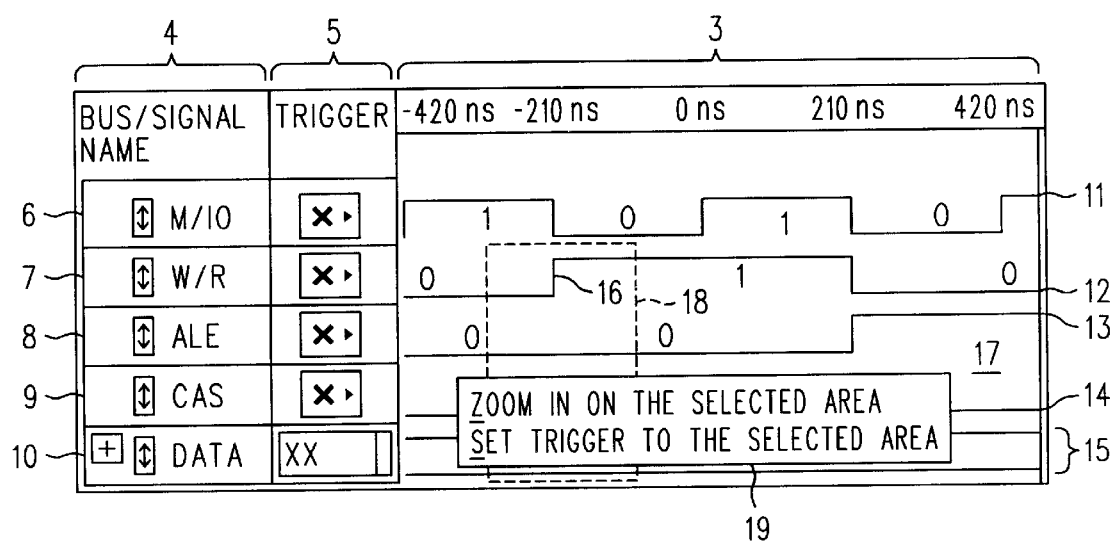
FIG. 2 is a representation of a logic analyzer waveform display screen having a rubber band box that may be drawn around portions of the displayed waveforms to define a trigger specification that is to be implemented automatically by the logic analyzer.

Refer now to FIG. 2, which is a waveform display screen 17 similar to that 1 shown in FIG. 1, except that the portions of signal waveforms W/R 12, ALE 13, CAS 14 and bus DATA 15 in the vicinity of transition 16 have been bounded by a rubber band box 18 (the lower right corner of which was subsequently obscured by a later production of menu 19). This is done by positioning the screen pointer (not shown) at one corner of the box, pressing the left mouse button and dragging the screen pointer to the diagonally opposite corner of the desired box. Releasing the left mouse button fixes the size and shape of the box 18. Once the box 18 has been drawn, the desire of the operator may be summarized with the phrase "Make this be the trigger."

Figure 3:
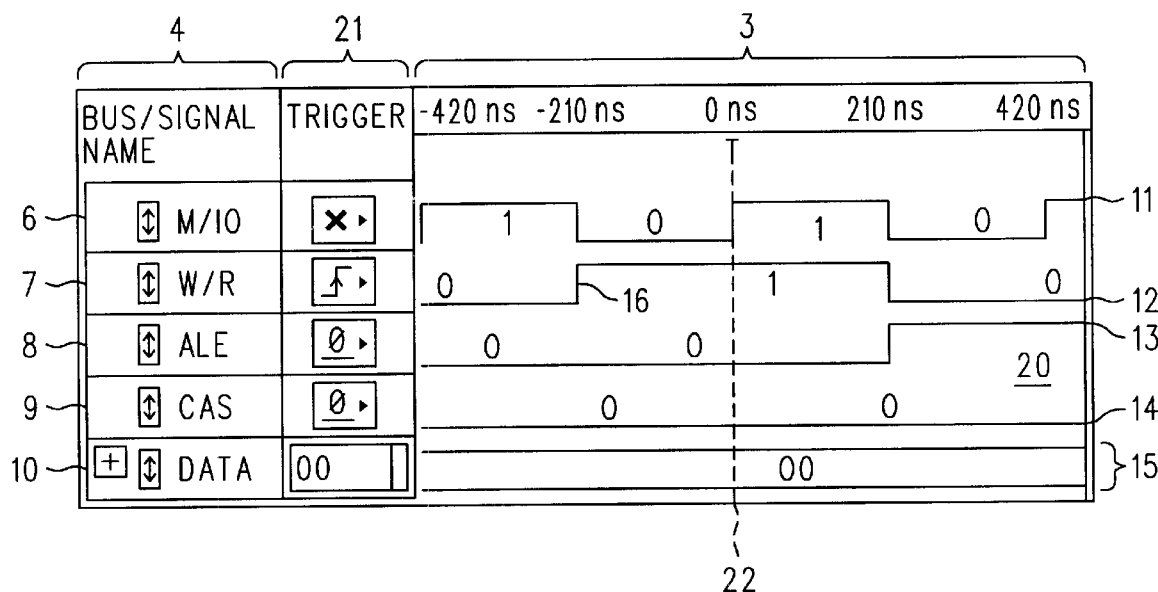
FIG. 3 is a representation of the waveform display screen of FIG. 2 subsequent to the implementation of the trigger specification indicated in FIG. 2, but prior to actually performing a new measurement.

To accomplish that the operator right clicks with the screen pointer positioned within the rubber band box 18. This produces the menu 19, one entry of which is "Set trigger to the selected area". The operator then chooses that entry in the menu 19. At this point the trigger specification is changed, as is indicated in FIG. 3. In FIG. 3 waveform display screen 20 has a simple trigger region 21 which is now filled in to require a rising edge (16) on the signal W/R 7, lows on the signals ALE 8 and CAS 9, and a (hexadecimal) value of 00 on the bus DATA 10. The reader will note that the waveforms shown in the waveform region 3 have not changed. That is because only the trigger specification has changed, and a new measurement has not yet been performed (other annunciators visible to the operator but not shown in the figure indicate these states of affairs). The results of performing a new measurement with the changed trigger specification according to rubber band box 18 are shown in FIG. 4.

Figure 4:
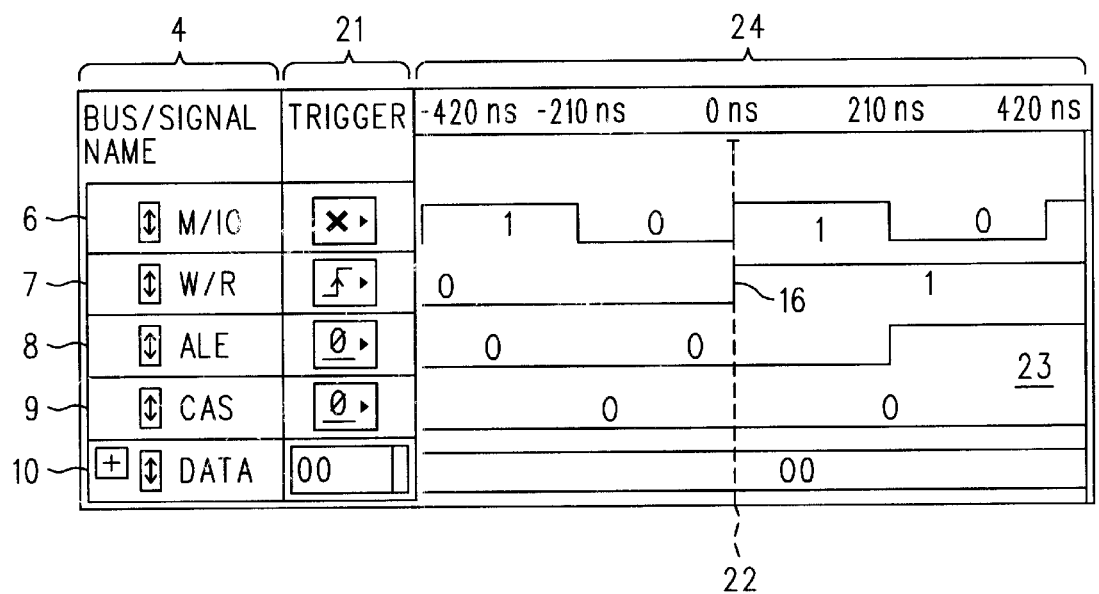
FIG. 4 is a representation of a waveform display screen obtained from performing a new measurement with the automatically implemented trigger specification of FIG. 2.

Referring briefly to FIG. 4, note the waveform display screen 23 includes a waveform display region 24 whose trace is changed (with respect to FIGS. 1–3). The actual content of the waveform trace in not the issue here, and we have not bothered to concocted an elaborate example involving the presumed trouble shooting and subsequent discovery of a pretended error mechanism. The point is that the operator was able to use a graphical method (the rubber band box 18) to select from existing measurement results a new trigger specification, which can then produce a new measurement, and so on. This mode of operation can be a considerable convenience for the operator of a logic analyzer (whose troubleshooting activities are presumably done for real).

Before proceeding, it should be noted that the trigger specification indicated by the rubber band box 18 and the simple trigger regions 21 of FIGS. 3 and 4 is the logical "AND" between the various conditions indicated. See the incorporated Application entitled LOGIC ANALYZER WITH MIXED TEXTUAL AND GRAPHICAL TRIGGER SPECIFICATION for a discussion of this issue. An "OR" of the conditions is not available with a graphical method, such as the one described herein, although is readily defined with a conventional textual trigger dialog method.

It should also be noted that if there is a single edge (transition) in a rubber band box it is interpreted as simply an edge, and not as a low/high occurring before the edge and a subsequent high/low occurring afterward. This will be the case even if the horizontal width of the rubber band box spans many consecutive acquisition samples taken by the hardware and stored in memory. Furthermore, multiple transitions are not allowed in a rubber band box. The following Table 1 is useful in connection with interpretations of rubber band box content:

TABLE I

| Waveform in the box | Interpretation |
|---|---|
| Bus or Signal that does not change value | Single value: high, low or bus value |
| Signal that changes once | Rising or falling edge |
| Signal that changes twice | Pulse |
| Signal that changes more than twice | Error - not supported |
| Bus that changes value | Error - not supported |

Figure 5:
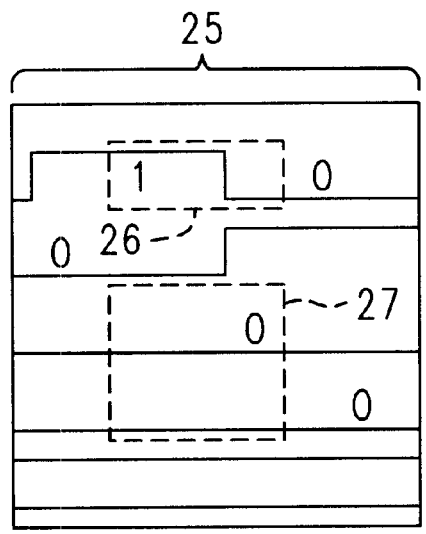
FIG. 5 is a representation of a portion of a waveform display screen having two rubber band boxes drawn therein to define disjoint but simultaneous waveform events as a trigger specification.
Figure 6:
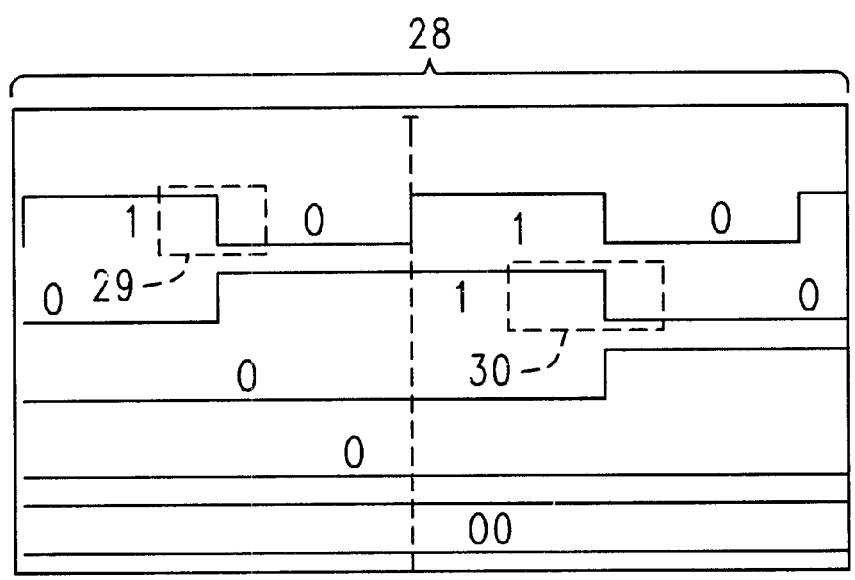
FIG. 6 is a representation of a portion of another waveform display screen also having two rubber band boxes drawn therein to define disjoint and sequential waveform events as a trigger specification.

It may be the case that the desired trigger specification identifiable in the waveform data cannot be grouped into one rubber band box. FIGS. 5 and 6 are examples of such situations. The shift key is used in conjunction with drawing more than one rubber band box. If it is held down while the mouse is moved and clicked, starting a new box will not erase a previous one. This allows drawing two or more rubber band boxes.

FIG. 5 depicts a waveform region 25 for a waveform display screen that includes two horizontally overlapping rubber band boxes 26 and 27. These are interpreted as defining conditions that are to occur simultaneously, and may be thought of as the logical AND of the falling edge in box 26 and the two low values of box 27.

Figure 7:
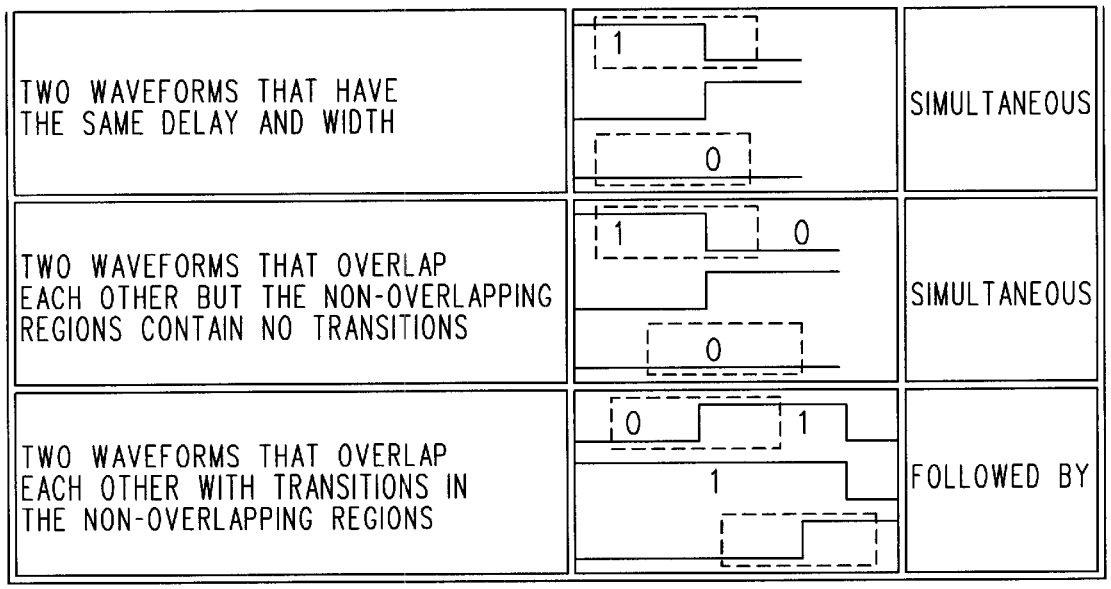
FIG. 7 is an illustration of the interpretation of different types of rubber banded waveform segments as being of the "simultaneous" type or of the "followed by" type.
Figure 8:
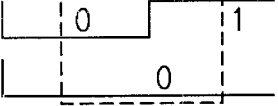
FIG. 8 is a more detailed examination of certain aspects of the "simultaneous" type of FIG. 7.

In the event that an operator invokes a trigger specification such as the one indicated in FIG. 6, some additional information is needed to make the trigger specification complete. The difference between rubber band box trigger specification situations that do not need more information and those that do may be summarized as "simultaneous" versus "followed by" (sequential). FIG. 7 shows various situations that illustrate this difference. In connection with FIG. 7, the simultaneous case is assumed when two transitions are clearly lined up vertically, even though they may result from different samples. FIG. 8 illustrates various instances of simultaneous trigger requirements and their interpretation, while FIG. 6 serves as an example for the "followed by" case. When this need for additional information arises (e.g., some relationship through a time interval) various interrogatory dialogs are automatically presented to the operator; see FIGS. 4 and 5 in the incorporated Application entitled LOGIC ANALYZER WITH MIXED TEXTUAL AND GRAPHICAL TRIGGER SPECIFICATION. Once these dialogs are completed the newly defined trigger specification is put into effect.

Figure 9:
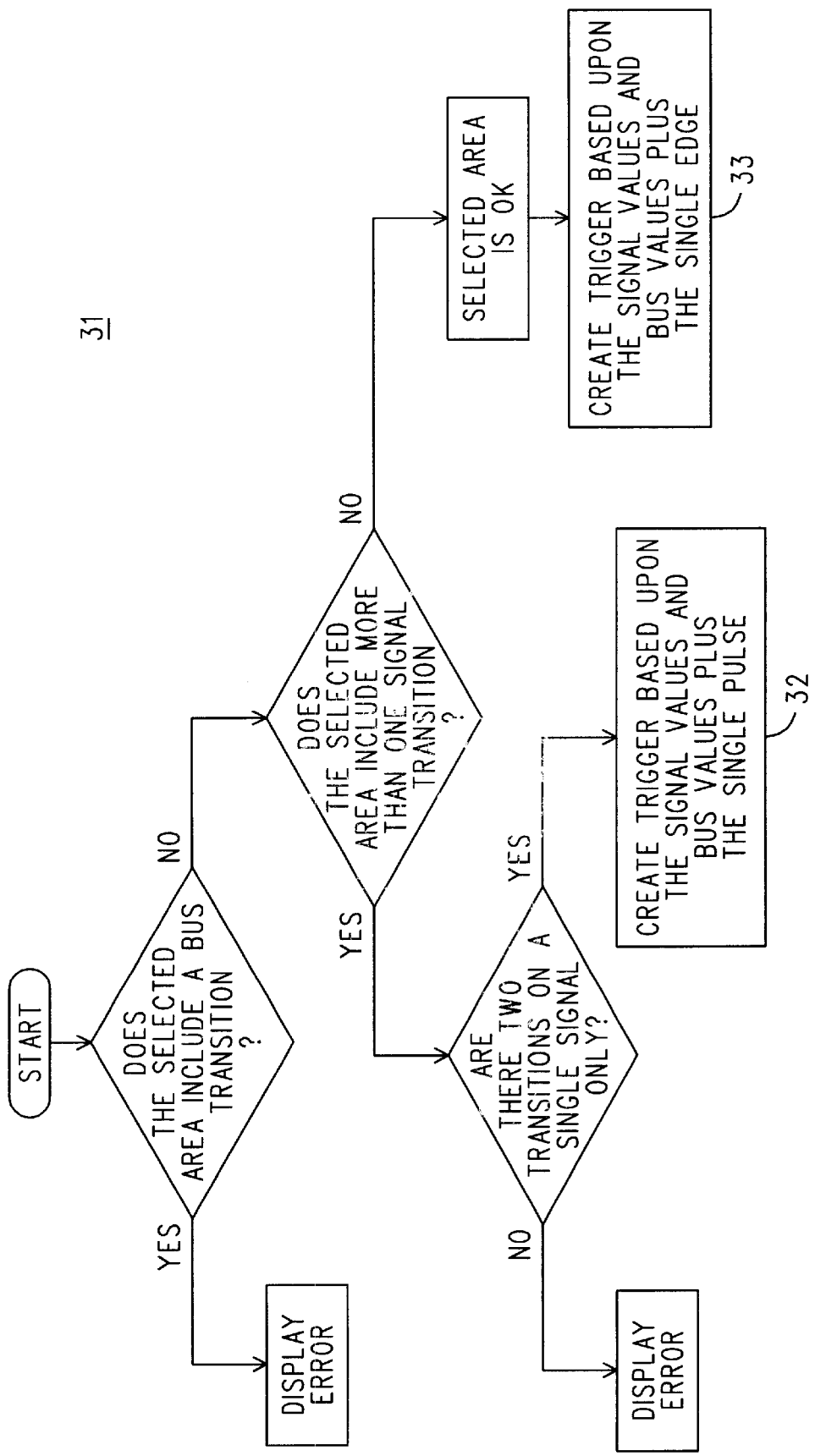
FIG. 9 is a flowchart useful in understanding an aspect of the invention.

It will be appreciated that a rubber band box can contain only one transition per signal (an edge or exactly two transitions for a signal (a pulse), and none for a bus. The flowchart 31 of FIG. 9 is useful in this connection. Upon completion of the initial checks performed by flow chart 31 steps 32 and 33 create the associated trigger specification.

A final word is in order concerning how the inspection of the data identified by the rubber band box(es) are interpreted. To begin with, it will be appreciated that inspecting the actual screen image itself would be a poor choice about how to proceed. For one thing, the view of the waveform region may have been zoomed way out, causing some potentially misleading artifacts to appear therein, and for another, there is actual sample data stored in an acquisition memory that will always represent the truth, insofar as it is known by the logic analyzer.

The logic analyzer system maintains, in a conventional and known way, a correspondence between the locations of samples in the acquisition memory and locations in the frame buffer used to supply a formatted screen image for the CRT. Thus, when the operator invokes the operating system to draw the rubber band box, the upper and lower limits of the box (certain scan lines of a raster scanned display) represent a horizontal strip of the CRT's display. These upper and lower limits are known by the operating system, are passed to the controlling algorithms in the logic analyzer where they are readily associated with certain labels, and through them, with certain signals. Each signal has its samples stored in a known section or collection of addresses in the acquisition memory. Hence, it can be detected what signals or buses are of interest.

In addition, the logic analyzer must, by virtue of what must be done to create a waveform display in the first place, keep track of the correspondence between (a) locations in the acquisition memory that represent the consecutive samples of a measurement and (b) the pixel positions along the scan line. The left and right pixel locations along the scan line for a rubber band box are known to the operating system, passed to the controlling algorithms in the logic analyzer, where they are associated with a sequence of consecutively stored samples in the acquisition memory. It is thus seen that it is possible to use this information to interrogate each successively stored sample for each signal and create a trigger specification from the exemplar of the data stored in the acquisition memory and specified by the one or more rubber band boxes. The interrogation identifies the high and low steady states in the exemplar, single transitions and pulses therein, as well as allowing the inspection of these along the time axis to decide issues of simultaneity versus the "followed by" case. The result of this inspection translates directly into a trigger specification.

Lastly, it will be appreciated that although we have described a process of selecting (or choosing, or highlighting) exemplars from captured or measured waveform data by drawing rubber band boxes, other mechanisms could be used besides the rubber band boxes. An exemplar could be indicated by changing its color or intensity in the screen where it is displayed. It could be made to blink something could be done every other part of the waveform except the exemplar; e.g., non selected waveform portions grayed out and the exemplar left alone. The important thing is that an exemplar is identified from within an existing waveform, and then used to create the corresponding trigger specification.

We claim:

1. Trigger specification apparatus in a logic analyzer, the apparatus comprising:

signal acquisition circuitry coupleable to a plurality of work signals in a work system;

a memory coupled to the signal acquisition circuitry and that stores acquired signal values;

a trigger circuit coupled to the signal acquisition circuitry and to the memory, and that terminates the storing of acquired signal values in a selected way in response to the occurrence in the plurality of work signals of events described in a trigger specification;

a graphical user interface defining the trigger specification, the graphical user interface itself comprising:

a display upon which screens of information are presented, which screens include a screen pointer;

a pointing device coupled to the display and that controls the position of the screen pointer within a screen;

a first screen displaying a captured waveform trace;

at least one waveform segment of the captured waveform trace being of altered appearance in accordance with its selection as an exemplar; and a command to convert the exemplar into a trigger specification.

2. Apparatus as in claim 1 wherein the altered appearance is created with a rubber band box.

3. Apparatus as in claim 1 wherein the first screen includes a portion that displays in symbolic form the trigger specification produced by converting the exemplar.

4. Apparatus as in claim 3 wherein the symbolic form includes iconic symbols representing waveform behavior.

5. Apparatus as in claim 3 wherein the symbolic form includes a text description of waveform behavior.

6. A method of defining a trigger specification for a logic analyzer, the method comprising:

performing a measurement with the logic analyzer upon a work system to produce a waveform trace of signals in the work system;

identifying at least one portion of the waveform trace to be an exemplar for a subsequent trigger specification; and automatically converting the exemplar into the subsequent trigger specification.

* * * * *